(12) United States Patent
Ohsaka et al.

(10) Patent No.: US 7,851,900 B2
(45) Date of Patent: Dec. 14, 2010

(54) STACKED SEMICONDUCTOR PACKAGE

(75) Inventors: Tohru Ohsaka, Yokohama (JP); Hiroshi Kondo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 642 days.

(21) Appl. No.: 11/378,685

(22) Filed: Mar. 17, 2006

(65) Prior Publication Data

US 2006/0208348 A1     Sep. 21, 2006

(30) Foreign Application Priority Data

Mar. 18, 2005  (JP) .............................. 2005-079878
Feb. 27, 2006  (JP) .............................. 2006-050593

(51) Int. Cl.
*H01L 23/02* (2006.01)

(52) U.S. Cl. ..................... 257/686; 257/685; 257/691; 257/698; 257/700; 257/778; 257/E23.021; 257/E23.062; 257/E23.079; 257/E23.178; 257/E25.013; 257/E25.021; 257/E25.023; 257/E25.018; 257/E25.006

(58) Field of Classification Search ................ 257/685, 257/700, 691, 698, 778, E23.062, E23.079, 257/23.178, E25.013, E25.023, 686, E23.021, 257/E25.018, E25.006, E25.021, E25.027, 257/E23.085; 247/686

See application file for complete search history.

(56) References Cited

U.S. PATENT DOCUMENTS 6,448,506 B1 *  9/2002  Glenn et al. ................ 174/260
2004/0135243 A1 *  7/2004  Aoyagi ....................... 257/686

FOREIGN PATENT DOCUMENTS

JP       2004-253667        9/2004

* cited by examiner

*Primary Examiner*—Lynne A Gurley
*Assistant Examiner*—Meiya Li
(74) *Attorney, Agent, or Firm*—Fitzpatrick, Cella, Harper & Scinto

(57) ABSTRACT

In a stacked semiconductor package, since electric power is supplied to a second semiconductor package through a first semiconductor package, a power supply path becomes complicated and fluctuation of its inductance becomes large, whereby power bounce occurs to reduce signal quality and also prevent high speed signal communication. Therefore, according to the present invention, a first solder ball group for joint to a printed wiring board is attached to a second layer of the first semiconductor package, and a second solder ball group for joint to the first semiconductor package and a solder group for power supply for direct joint to the printed wiring board are provided on the second layer of the second semiconductor package, whereby electric power can be directly supplied from the printed wiring board.

11 Claims, 11 Drawing Sheets

Prior Art

STACKED SEMICONDUCTOR PACKAGE

BACKGROUND OF THE INVENTION

1. Field of the Invention

The present invention relates to a stacked semiconductor package obtained by three-dimensionally stacking a plurality of semiconductor packages each having at least one semiconductor chip mounted thereon.

2. Related Background Art

Up to now, a semiconductor package to be used in an electronic equipment adopts a ball grid array (BGA) in which lands are formed in a grid pattern or a chip scale package (CSP) to thereby attain electronic equipments with a smaller size and a higher performance. Also, in recent years, as the electronic equipment grows more sophisticated, the electric circuits used therein become increasingly larger in size. Accordingly, in order to materialize an electric circuit with high density, a stacked semiconductor package in which semiconductor packages are three-dimensionally stacked is gradually used.

A system in package (SIP) structure and a package on package (POP) structure have been known as structures of a three-dimensionally stacked semiconductor package. Japanese Patent Application Laid-Open No. 2004-253667 discloses a stacked semiconductor package having the SIP structure. FIG. 16 shows a sectional view of a stacked semiconductor package having a typical SIP structure.

In FIG. 16, a printed wiring board 1001 has a stacked semiconductor package 1000 mounted thereon. The stacked semiconductor package 1000 has a two-layer structure composed of a first semiconductor package 1010 and a second semiconductor package 1020.

The first semiconductor package 1010 is formed of a first package substrate 1011, a first LSI 1012, and a solder ball group 1015. The first LSI 1012 is mounted on an upper surface of the first package substrate 1011 by a flip chip method, a wire bonding method, a CSP method, a BGA method, or the like. The solder ball group 1015 is provided on a lower surface of the first package substrate 1011 and is connected to the printed wiring board 1001.

The second semiconductor package 1020 is formed of a second package substrate 1021, a second LSI 1022, a third LSI 1023, and a solder ball group 1025. The second LSI 1022 and the third LSI 1023 are mounted on an upper surface of the second package substrate 1021 by a flip chip method, a wire bonding method, a CSP method, a BGA method, or the like. The solder ball group 1025 is provided on a lower surface of the second package substrate 1021.

The stacked semiconductor package 1000 is formed by joining the first semiconductor package 1010 and the second semiconductor package 1020 together with the solder ball group 1025. The stacked semiconductor package 1000 is mounted on the printed wiring board 1001 with the solder ball group 1015.

Usually, the LSI 1012 mounted on the first semiconductor package 1010 is an LSI which functions as a LOGIC circuit or an MPU circuit for providing functionality of a product. This is because, since the LOGIC circuit or the MPU circuit disposed on the first semiconductor package 1010 frequently transmits/receives a signal to/from a circuit on the printed wiring board, it is advantageous to dispose such the circuits adjacent to the printed wiring board 1001 in terms of the functionality of the product. On the other hand, the LSIs 1022 and 1023 mounted on the second semiconductor package 1020 are LSIs which function as a memory for data processing. The memories disposed in the second semiconductor package 1020 mostly transmit/receive a signal to/from the LOGIC circuit or the MPU circuit disposed in the first semiconductor package 1010. Therefore, it is advantageous to dispose such the memory adjacent to the LOGIC circuit or the MPU circuit rather than to the printed wiring board 1001 in terms of the functionality of the product.

Such the two-layer structure makes smaller the area on the printed wiring board 1001 occupied by components to thereby contribute to the higher density of an electronic equipment circuit. Further, the distance between the two semiconductor packages becomes smaller, which is also effective for higher speed communication between the LSIs.

Japanese Patent Application Laid-Open No. 2004-253667 discloses another method of manufacturing such a stacked semiconductor package. The disclosed method is described with reference to the stacked semiconductor package illustrated in FIG. 16. First, the second package substrate 1021 having the second LSI 1022 and the third LSI 1023 mounted thereon is flipped and fixed on a jig. Then, solder paste is printed on lands for solder connection which is formed in advance on the upper surface of the second package substrate 1021. Then, the first package substrate 1011 having the first LSI 1012 mounted thereon and having the solder ball group 1025 attached to the upper surface thereof is, in an flipped state, stacked on the second package substrate 1021 fixed on the jig. Here, the location of the solder ball group 1025 is adjusted so as to align with the solder paste printed on the lands for solder connection. After that, the stacked first package substrate 1011 and second package substrate 1021 are introduced into a reflow furnace together with the jig. By heating the inside of the furnace to a temperature higher than the melting points of the solder paste and of the solder ball group 1025 and then cooling them, the first package substrate 1011 and the second package substrate 1021 are joined together into the stacked semiconductor package.

In the stacked semiconductor package illustrated in FIG. 16, as described in the above, devices mounted in the second semiconductor package 1020 are usually LSIs which function as a memory for data processing. The structure as shown in FIG. 16 is very effective in transmitting/receiving a signal between LSIs 1022 and 1023 functioning as the memory and the LSI 1012 for functioning in a LOGIC circuit or an MPU circuit disposed in the first semiconductor package 1010. However, it is necessary that the LSIs 1022 and 1023 for functioning as the memory are required to be supplied not only with a signal from the LSI 1012 functioning in the LOGIC circuit or the MPU circuit but also with electric power and a ground (GND).

FIG. 17 is a sectional view illustrating a power supply path in the stacked semiconductor package 1000 illustrated in FIG. 16. In FIG. 17, the reference numeral 1050 denotes the power supply path, and the same reference numerals as those of FIG. 16 designate the same members to those shown in FIG. 16, respectively. As can be seen from FIG. 17, in the stacked semiconductor package 1000, the electric power and the GND are supplied to the LSIs 1022 and 1023 which function as the memory from the printed wiring board 1001 via the first semiconductor package 1010. More specifically, the path starts at the printed wiring board 1001 and goes through the solder ball group 1015, the first package substrate 1011, the solder ball group 1025, and the second package substrate 1021 to reach the LSIs 1022 and 1023. Therefore, the number of joints in the power supply path becomes large, and transmitting conditions in the path change significantly depending on the location. Therefore, fluctuation of its inductance in the power supply path becomes large, power bounce takes place, and it is difficult to obtain stable signal quality, which also prevents high speed signal communication.

When the second semiconductor package 1020 has a plurality of memory LSIs mounted therein with different power supply voltages, different power supply paths corresponding to the respective LSIs have to be provided. More specifically, both of the number of solder balls of the group 1015 for connecting the first package substrate 1011 and the printed wiring board 1001 and the number of solder balls of the group 1025 for connecting the layer package substrate 1011 and the second package substrate 1021 are required to be increased. Therefore, both the size of the first package substrate 1011 and the size of the second package substrate 1021 are increased.

SUMMARY OF THE INVENTION

The present invention has been made in view of the problems described in the above. Therefore, an object of the present invention is to realize high speed transmission of a signal with high quality without increasing the size of a stacked semiconductor package.

In order to attain the above objects, the present invention provides a stacked semiconductor package formed by stacking a plurality of semiconductor packages, comprising:

a first semiconductor package counting first from a side of a printed wiring board having the stacked semiconductor package mounted thereon, the first semiconductor package comprising:

a first semiconductor package substrate;

at least one LSI mounted on a first layer of the first semiconductor package substrate; and a first solder ball group attached to a second layer of the first semiconductor package substrate, for joint to the printed wiring board; and a second semiconductor package stacked on the first semiconductor package, the second semiconductor package comprising:

at least one LSI mounted on a first layer of the second semiconductor package substrate;

a second solder ball group attached to a second layer of the second semiconductor package substrate, for joint to the first semiconductor package; and a solder group attached to the second layer of the second semiconductor package substrate, for joint to the printed wiring board. Here, the "first layer" and "second layer" of the first semiconductor package substrate mean the front or upper surface (or surface layer) and the rear or lower surface (or surface layer) of the first semiconductor package substrate, respectively. Similarly, the "first layer" and "second layer" of the second semiconductor package substrate mean the front or upper surface (or surface layer) and the rear or lower surface (or surface layer) of the second semiconductor package substrate, respectively.

The present invention also provides a stacked semiconductor package formed by stacking a plurality of semiconductor packages, comprising:

a first semiconductor package counting first from a side of a printed wiring board having the stacked semiconductor package mounted thereon, the first semiconductor package comprising:

a first semiconductor package substrate;

at least one LSI mounted on a first layer of the first semiconductor package substrate; and an area grid array attached to a second layer of the first semiconductor package substrate, for joint to the printed wiring board; and a second semiconductor package stacked on the first semiconductor package, the second semiconductor package comprising:

a second semiconductor package substrate having an area larger than an area of the first semiconductor package;

at least one LSI mounted on a first layer of the second semiconductor package substrate; and a second solder ball group attached to a second layer of the second semiconductor package substrate, for joint to the first semiconductor package.

Further, the present invention provides a stacked semiconductor package formed by stacking a plurality of semiconductor packages, comprising:

a first semiconductor package having at least one LSI mounted therein; and a second semiconductor package stacked on the first semiconductor package, the second semiconductor package including a solder group for power supply for direct connection to the printed wiring board.

Further, the present invention provides a stacked semiconductor package formed by stacking a plurality of semiconductor packages, comprising:

a first semiconductor package having at least one LSI mounted therein; and a second semiconductor package stacked on the first semiconductor package, the second semiconductor package including a solder group for a ground for direct connection to the printed wiring board.

Further, the present invention provides a stacked semiconductor package formed by stacking a plurality of semiconductor packages, comprising:

a first semiconductor package having at least one LSI mounted thereon; and a multi-layered semiconductor package group stacked on the first semiconductor package, wherein at least one semiconductor package of the multi-layered semiconductor package group includes a solder ball group for power supply for direct connection to the printed wiring board.

Further, the present invention provides a stacked semiconductor package formed by stacking a plurality of semiconductor packages, comprising:

a first semiconductor package having at least one LSI mounted thereon; and a multi-layered semiconductor package group stacked on the first semiconductor package, wherein at least one semiconductor package of the multi-layered semiconductor package group including a solder ball group for a ground for direct connection to the printed wiring board.

Further, the present invention provides a stacked semiconductor package comprising:

a plurality of stacked package substrates;

at least one LSI mounted on each of the plurality of package substrates;

a solder ball group for joint of adjacent package substrates of the plurality of package substrates;

a solder group for power supply for joint of nonadjacent package substrates of the plurality of package substrates; and a solder ball group attached to a lowest layer package substrate of the plurality of stacked package substrates, for joint to a printed wiring board on which the stacked semiconductor package is to be mounted.

Further, the present invention provides a stacked semiconductor package comprising:

a plurality of stacked package substrates;

at least one LSI mounted on each of the plurality of package substrates;

a solder ball group for joint of adjacent package substrates of the plurality of package substrates;

a solder group for a ground for joint of nonadjacent package substrates of the plurality of package substrates; and a solder ball group attached to a lowest layer package substrate of the stacked plurality of package substrates, for joint to a printed wiring board on which the stacked semiconductor package is to be mounted.

The above and other objects of the Invention will become more apparent from the following embodiments taken in conjunction with the accompanying drawings.

DESCRIPTION OF THE PREFERRED EMBODIMENTS

The best mode for implementing the present invention is now described below based on the following embodiments.

First Embodiment

Figure 1:
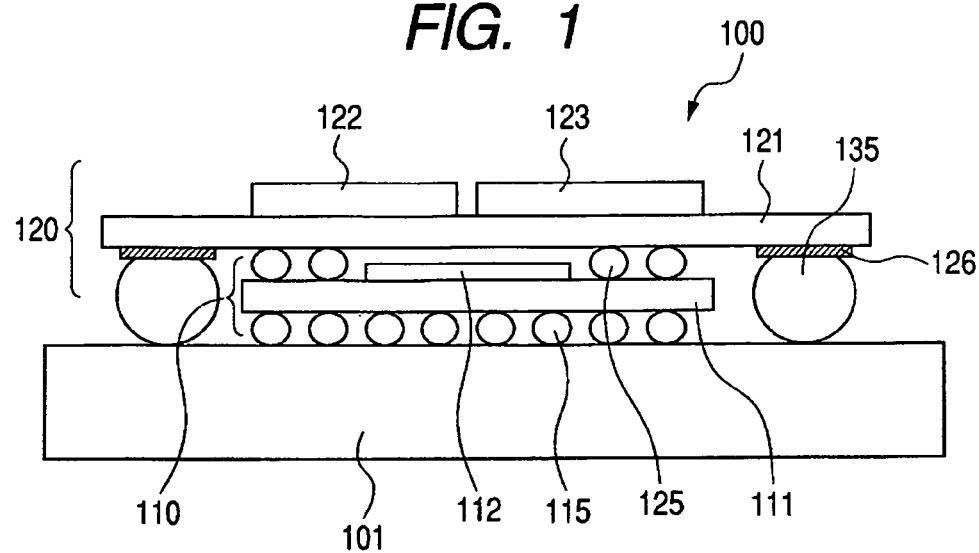
FIG. 1 is a sectional view of a stacked semiconductor package according to first Embodiment of the present invention.

FIG. 1 is a sectional view of a stacked semiconductor package 100 according to first Embodiment of the present invention. In FIG. 1, the stacked semiconductor package 100 is mounted on a printed wiring board 101. The stacked semiconductor package 100 has a two-layer structure composed of a first semiconductor package 110 and a second semiconductor package 120.

The first semiconductor package 110 is formed of a square-shaped first package substrate 111, a first LSI 112, and a solder ball group 115. The first LSI 112 is mounted on an upper surface of the first package substrate 111 by a flip chip method. The LSI 112 is a LOGIC circuit which is responsible for the functionality of the product. A solder ball group 115 for electrically connecting the first package substrate 111 and the printed wiring board 101 is provided on a lower surface of the first package substrate 111.

The second semiconductor package 120 is formed of a square-shaped second package substrate 121, a second LSI 122, a third LSI 123, and solder ball groups 125 and 135. The second package substrate 121 has an area which is larger than that of the first package substrate 111. The second LSI 122 and the third LSI 123 are mounted on an upper surface of the second package substrate 121 by a flip chip method. The LSIs 122 and 123 are LSIs which function as a memory for data processing. Provided on a lower surface of the second package substrate 121 are the solder ball group 125 for electrically connecting to the first package substrate 111 and the solder ball group 135 for electrically connecting to the printed wiring board 101. The diameter of the solder balls of the solder ball group 135 is larger than the diameter of the solder balls of the solder ball group 115 and larger than the diameter of the solder balls of the solder ball group 125. The solder ball group 135 is attached to lands 126 for power supply provided on the lower surface of the second package substrate 121, and is connected to lands for power supply (not shown) of the printed wiring board 101.

Figure 2:
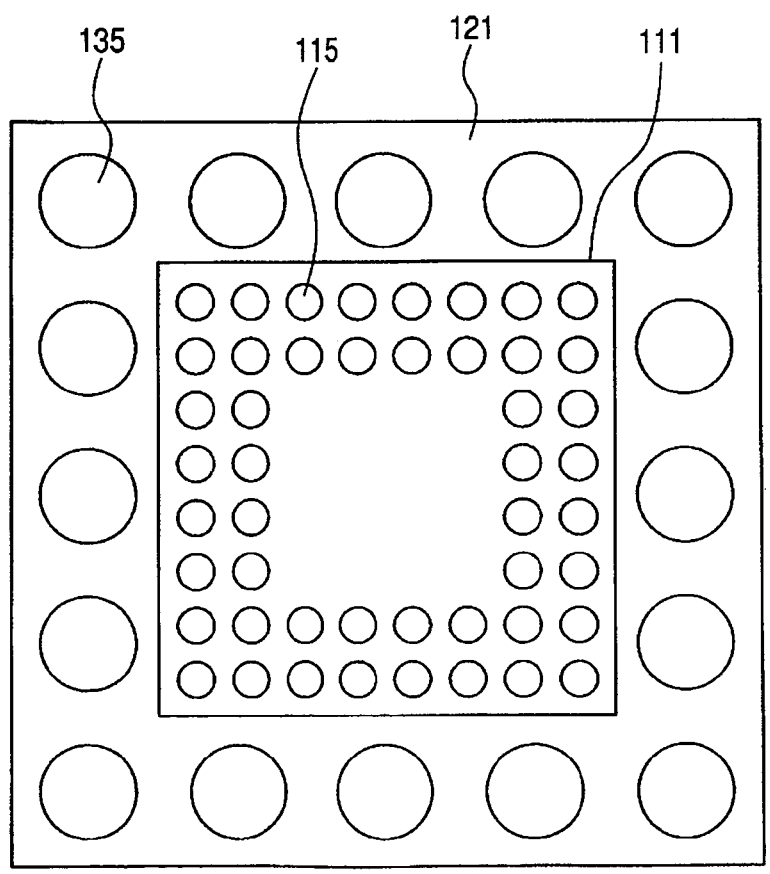
FIG. 2 is a plan view of the stacked semiconductor package according to first Embodiment of the present invention.

FIG. 2 is a plan view of the stacked semiconductor package illustrated in FIG. 1 which is seen from the side of the printed wiring board 101 through the printed wiring board 101. As can be seen from FIG. 2, the second package substrate 121 has an area larger than an area of the first package substrate 111, and the first package substrate 111 is arranged at such position that the first package substrate 111 is not protruded from the outer periphery of the second package substrate 121. The solder ball group 135 is disposed on an outer peripheral portion of the second package substrate 121. More specifically, the first package substrate 111 is joined to the second package substrate 121 through the solder ball group 115 at a center portion of the second package substrate 121. The solder ball group 135 of a larger diameter is disposed to surround the second package substrate 121.

By disposing the solder ball group 135 so as to surround the second package substrate 121, the density of wiring on the printed wiring board extending from the stacked semiconductor package 100 can be made lower at the outside. This makes it very easy to pull out the wiring from the solder ball group 115 at the center and increases the flexibility in design of the substrate.

Further, the stacked semiconductor package 100 is mounted on the printed wiring board 101 via the solder ball group 135 of a larger diameter and via the solder ball group 115. Therefore, in order to secure reliability in packaging, the tip positions of the solder ball group 135 in contact with the printed wring board 101 must be on the same plane with the tip positions of the solder ball group 115 in contact with the printed wring board 101. In the present embodiment, by adjusting the diameter of the solder balls of the solder ball group 135, the mounting positions are adjusted. It should be noted that, when the mounting surface of the printed wiring board is not flat and is slanted or has a step height, the reliability in packaging is secured by adjusting the diameters of the respective solder balls.

Further, since the solder ball group 135 is connected to the lands 126 for power supply of the printed wiring board 101, it is sometimes time-consuming to melt the solder. In such a case, the material of the solder ball group 135 of a larger diameter is selected such that its melting point is lower than that of the solder ball group 115 to attain satisfactory packaging.

Figure 3:
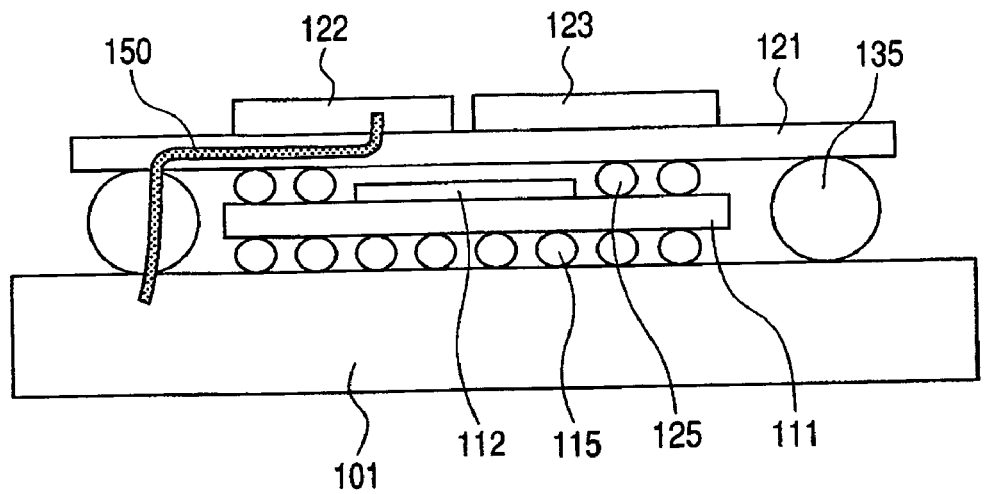
FIG. 3 is a schematically sectional view for explaining a power supply path of the stacked semiconductor package according to first Embodiment of the present invention.

FIG. 3 is a sectional view for explaining a power supply path to the second package substrate 121 of the stacked semiconductor package 100 illustrated in FIG. 1 according to the present invention. In this figure, a reference numeral 150 denotes the power supply path. As can be seen from FIG. 3, electric power is supplied to the LSI 122 mounted on the second package substrate 121 directly from the printed wiring board 101 without going through the first semiconductor package. More specifically, the power supply path 150 to the LSIs 122 and 123 mounted on the second package substrate 121 starts at the printed wiring board 101 and goes through the solder ball group 135 and the second package substrate 121 to reach the LSIs 122 and 123.

Figure 17:
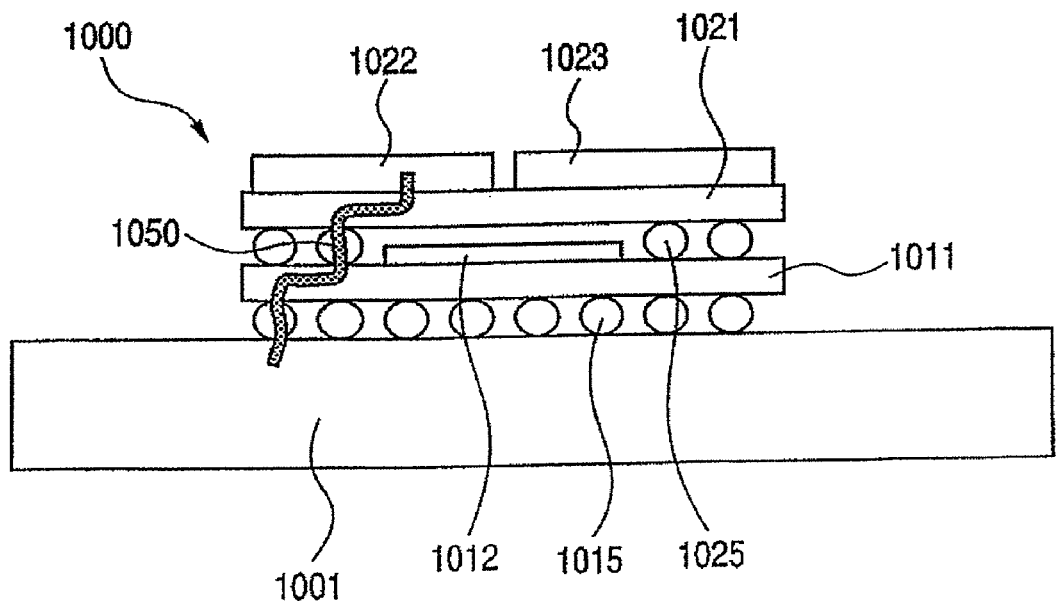
FIG. 17 is a schematic view for explaining a power supply path of the conventional stacked semiconductor package.

Compared with the conventional power supply path 1050 described in the above and illustrated in FIG. 17, the power supply path 150 illustrated in FIG. 3 is a simple short path, and the number of connection points in the power supply path is substantially decreased. More specifically, the connection points in the power supply path 150 illustrated in FIG. 3 are only connection points between the printed wiring board 101 and the solder ball group 135 and between the solder ball group 135 and the second package substrate 121. On the other hand, the connection points in the power supply path 1050 of the conventional stacked semiconductor package 1000 are connection points between the printed wiring board 1001 and the solder ball group 1015, between the solder ball group 1015 and the lands for power supply provided on the lower surface of the first package substrate 1011, between the lands for power supply provided on the lower surface of the first package substrate 1011 and the solder ball group 1025, and between the solder ball group 1025 and the lands for power supply provided on the lower surface of the second package substrate 1021.

Accordingly, the inductance of the power supply path 150 illustrated in FIG. 3 is far more stable than that of the power supply path 1050 illustrated in FIG. 17. This makes it possible to maintain constant the power supply voltage, to prevent power bounce and power supply voltage drop from taking place, and to transmit/receive a signal with high quality at a high speed with stability. Further, it is not necessary that the solder ball group 135 is connected to the lands 126 for power supply, and the solder ball group 135 may be connected to a land for ground. When the solder ball group 115 is connected to the ground (GND) of the printed wiring board 101, the GND can be made stable, and, similarly to the case of the power supply, a signal with high quality can be transmitted/received at a high speed with stability. Further, when it is necessary to directly transmit/receive a signal between the second semiconductor package 120 and the printed wiring board 101, the solder ball group 135 may be connected to a land for signal.

Figure 5:
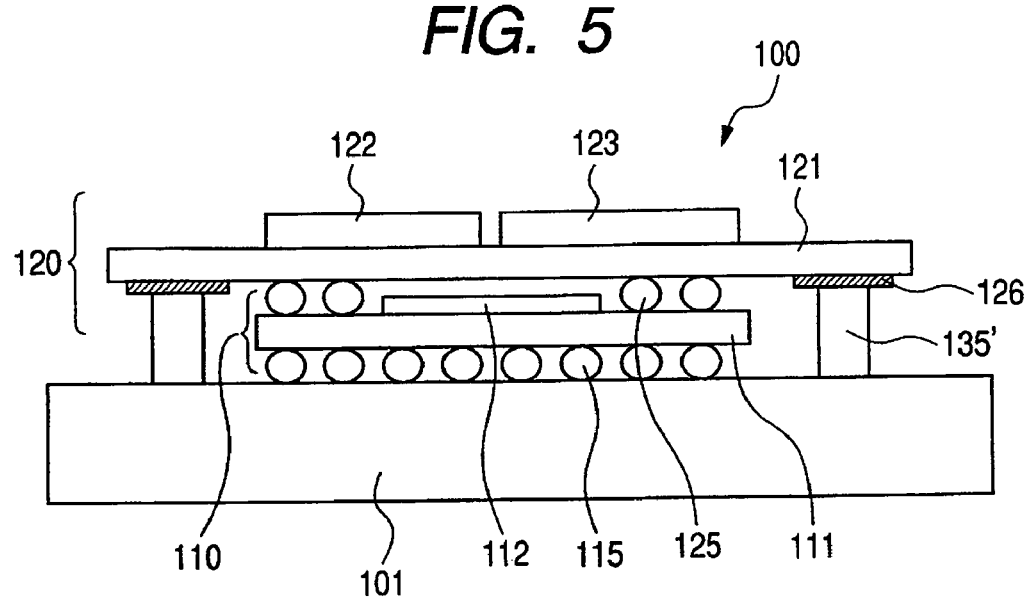
FIG. 5 is a sectional view of a variation of the stacked semiconductor package according to first Embodiment of the present invention.

As the variation of the present embodiment, a cylindrical solder group 135' as shown in FIG. 5 can be used in place of the solder ball group 135. In the case of the solder ball 135, the diameter of the solder balls must be made larger when the distance between the printed wiring board 101 and the lower surface of the second package substrate 121. Therefore, the area of the second package substrate 121 becomes larger. However, by using the cylindrical solder group 135', the second package substrate 121 can be connected to the printed wiring board 101 without increasing the area of the second package substrate 121.

Figure 6:
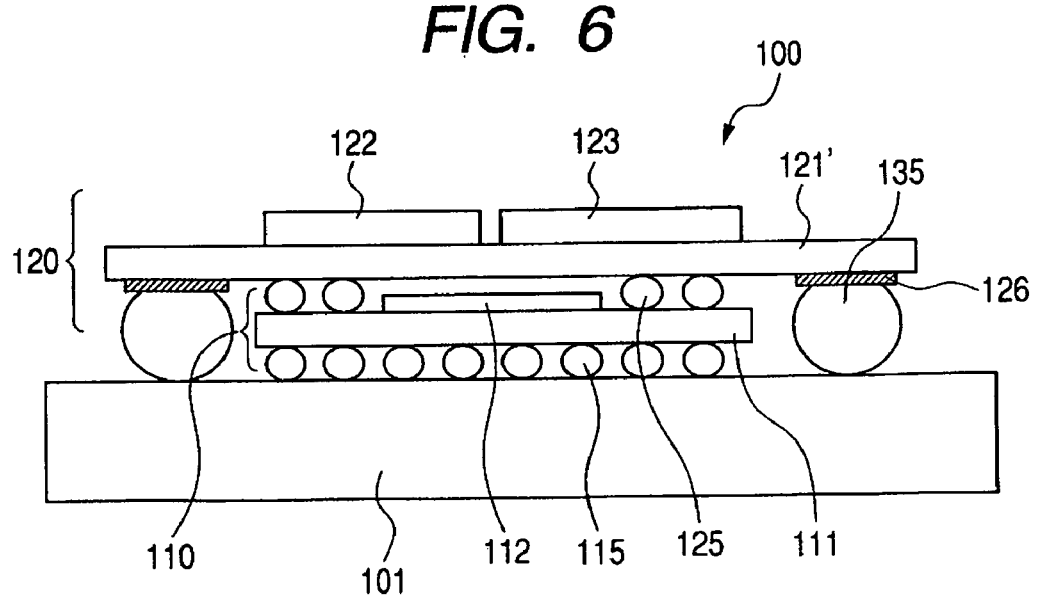
FIG. 6 is a plan view of another variation of the stacked semiconductor package according to first Embodiment of the present invention.
Figure 7:
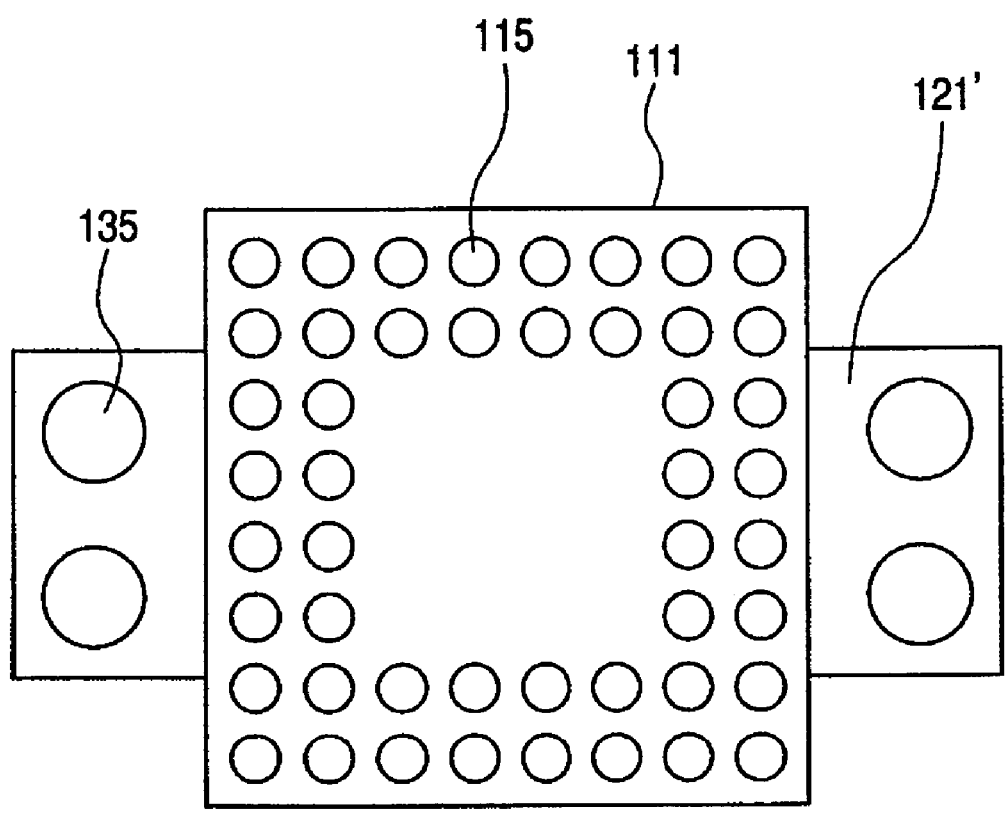
FIG. 7 is a sectional view of another variation of the stacked semiconductor package according to first Embodiment of the present invention.

Further, as the variation of the present embodiment, the present invention can be applied in the case of the second package substrate having an area larger than the area of the first package substrate. FIG. 6 is a sectional view of showing the stacked semiconductor package in such case. FIG. 7 is a plan view of the stacked semiconductor package as seen from the side of the printed wiring board 101 through the printed wiring board 101. The same reference numerals in FIGS. 6 and 7 as those of FIG. 5 denote the same members as those of FIG. 5, respectively. In FIG. 6, the second package substrate 121' has a rectangular shape. As seen from FIG. 7, a part of the first package substrate is protruded from the outer periphery of the second package substrate. Also, a part of the second package substrate is protruded from the outer periphery of the first package substrate. The solder ball group 125 for electrical connection to the first package substrate 111 and the solder ball group 135 for electrical connection with the printed wiring board 101 are provided on these protruded portions.

Figure 4:
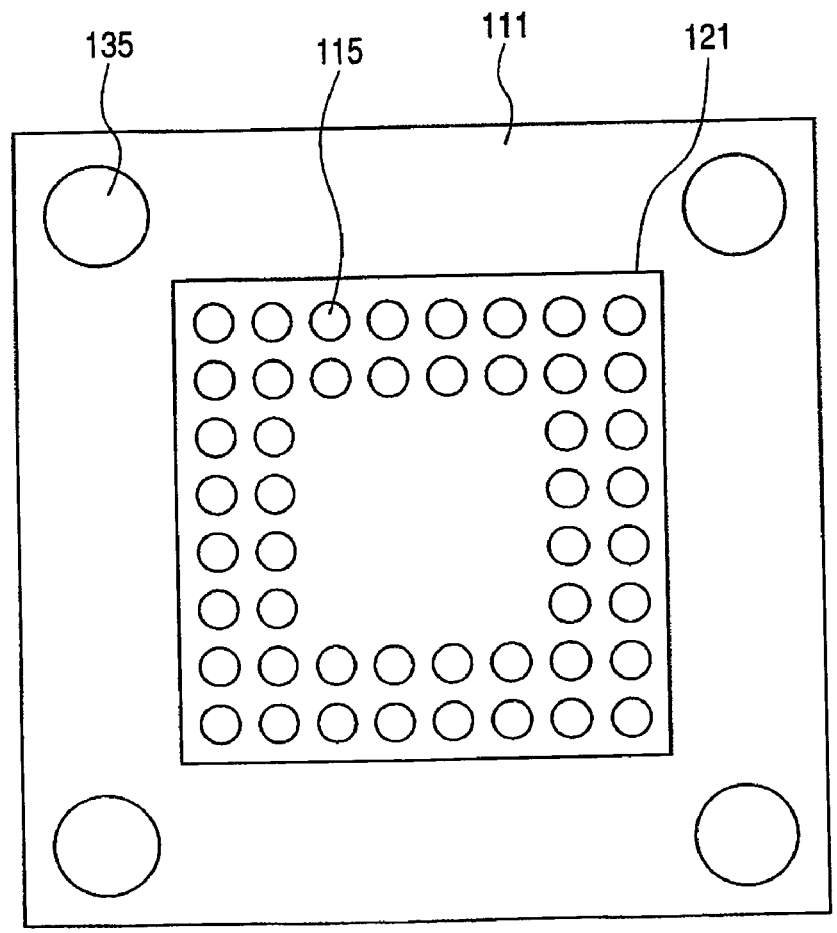
FIG. 4 is a plan view of a variation of the stacked semiconductor package according to first Embodiment of the present invention.

It should be noted that, in the present embodiment, the solder ball group 135 are disposed to surround the first package substrate 111. However, the present invention is not limited thereto, and the solder ball group 135 of a larger diameter may be disposed anywhere with respect to the second semiconductor package 120. Further, as illustrated in FIG. 4, the solder ball group 135 of a larger diameter may be disposed only in the corners of the second package substrate 121. This makes it still easier to pull out the wiring from the solder ball groups 115 at the center and further increases the flexibility in designing the substrate.

It should be noted that, in the present embodiment, the first LSI 112 is mounted on the first package substrate 111, and the second and third LSIs 122 and 123 are mounted on the second package substrate 121 both by a flip chip method. However, the present invention is not limited thereto, and any of a wire bonding method, a CSP method, and a BGA method may be used.

Second Embodiment

Figure 8A:
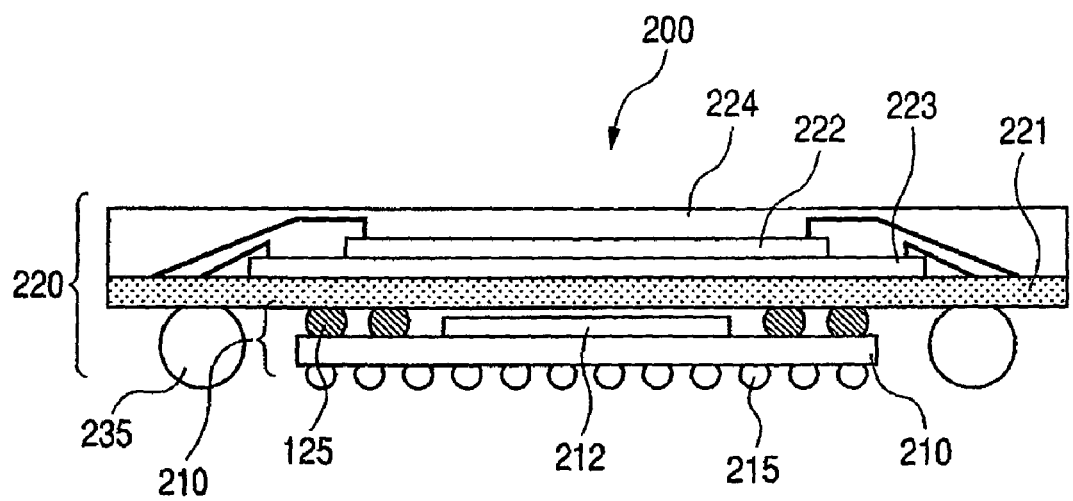
FIGS. 8A and 8B are a sectional view and a plan view, respectively, of a stacked semiconductor package according to second Embodiment of the present invention.
Figure 8B:
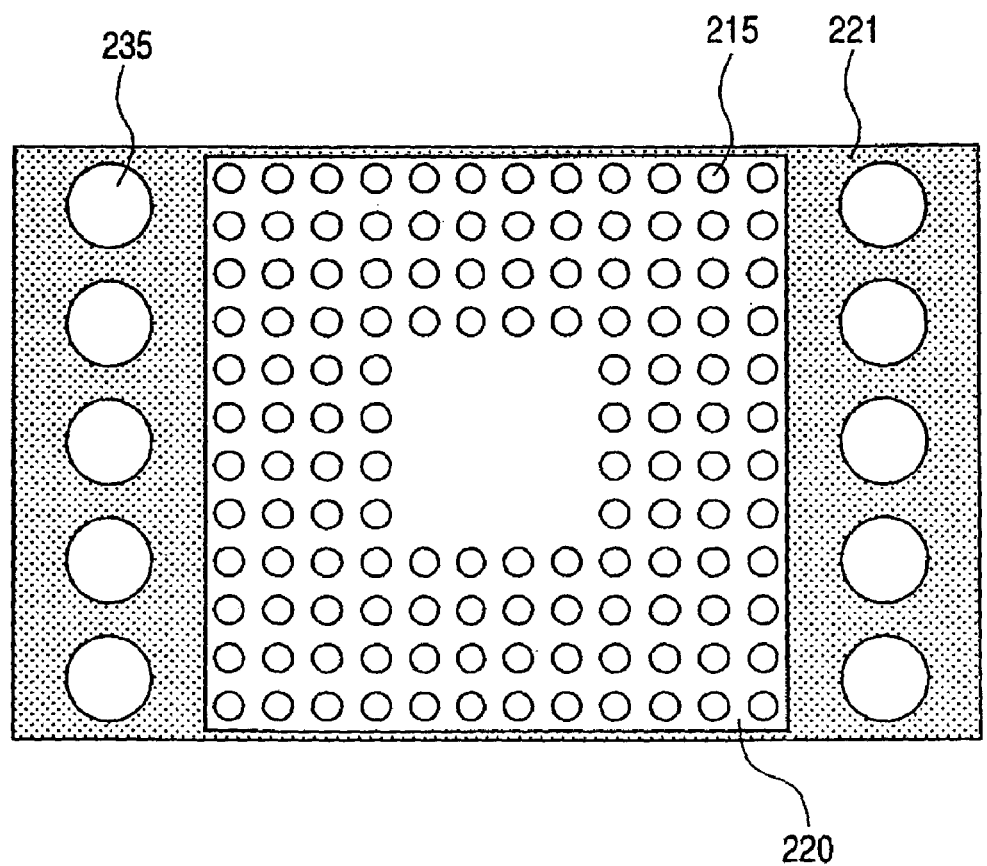

FIG. 8 is a schematic view of a stacked semiconductor package 200 according to second Embodiment of the present invention. FIG. 8A is a sectional view of the stacked semiconductor package 200 and FIG. 8B is a plan view seen from the bottom. The stacked semiconductor package 200 has a two-layer structure composed of a first semiconductor package 210 and a second semiconductor package 220.

The first semiconductor package 210 is formed of a first package substrate 211, a first LSI 212, and a solder ball group 215. The first LSI 212 is mounted on an upper surface of the first package substrate 211 by a flip chip method. The LSI 212 is an MPU circuit which is responsible for the functionality of a product. A solder ball group 215 for electrically connecting the first package substrate 211 and the printed wiring board (not shown) is provided on a lower surface of the first package substrate 211.

The second semiconductor package 220 is formed of a second package substrate 221, a flash memory 222, a dynamic random access memory (DRAM) 223, a package mold resin 224, and solder ball groups 225 and 235. The second package substrate 221 has an area which is larger than that of the first package substrate 211. The flash memory 222 and the DRAM 223 are stacked on an upper surface of the second package substrate 221 by a wire bonding method. Provided on a lower surface of the second package substrate 221 are the solder ball group 225 for electrically connecting to the first package substrate 211 and the solder ball group 235 for electrically connecting to the printed wiring board (not shown). The diameter of the solder balls of the solder ball group 235 is larger than the diameter of the solder balls of the solder ball group 215 and larger than the diameter of the solder balls of the solder ball group 225. The solder ball group 215 is connected to lands for power supply of the printed wiring board.

As can be seen from FIG. 8B, the solder ball group 235 is disposed on both side portions of the second package substrate 221. More specifically, the first package substrate 211 having an area smaller than that of the second package substrate 221 is connected to the second package substrate 221 via the solder ball group 215 at the center of the second package substrate 221. The solder ball group 235 is disposed along both sides of the first package substrate 211 opposed to each other.

The diameter of each solder ball of the solder ball group 225 is $\phi$0.3 mm, and the pitch between the balls is 0.65 mm. The thickness of the first package substrate 211 is 0.3 mm. The diameter of each solder ball of the solder ball group 215 is $\phi$0.25 mm, and the pitch between the balls is 0.50 mm. Therefore, the diameter of each solder ball of the solder ball group 235 is $\phi$0.85 mm. Since a solder ball spreads upon joining and is no longer a perfect sphere, the diameter in the height direction of each solder ball after the joining is slightly smaller than that before the joining. The pitch between balls of the solder ball group 235 of the second semiconductor package 210 is 1.27 mm.

Next, a method of manufacturing the stacked semiconductor package 101 according to second Embodiment of the present invention is now described with reference to FIGS. 9A, 9B, 9C and 9D. FIGS. 9A, 9B, 9C and 9D are schematic sectional views illustrating process steps for manufacturing the stacked semiconductor package 101.

Figure 9A:
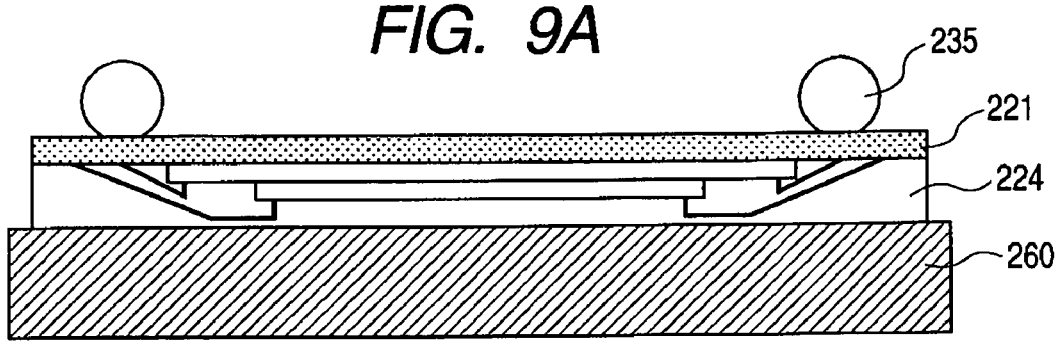
FIGS. 9A, 9B, 9C, and 9D are sectional views illustrating a method of manufacturing the stacked semiconductor package according to second Embodiment of the present invention.

First, a multi chip package (MCP) formed by stacking a flash memory 222 and a DRAM 223 is mounted on an upper surface of the second package substrate 221, and is encapsulated by a package mold resin 224. The solder ball group 235 of a larger diameter is attached to an outer peripheral portion of the second package substrate 221. Here, the solder ball group 235 is attached to lands for power supply (not shown) connected to power supply terminals of the flash memory 222 and the DRAM 223. Next, as illustrated in FIG. 9A, the second package substrate 221 is flipped and fixed to an adherent jig substrate 260 (Magic Resin Carrier available from Daisho Denshi Co., Ltd.).

Figure 9B:
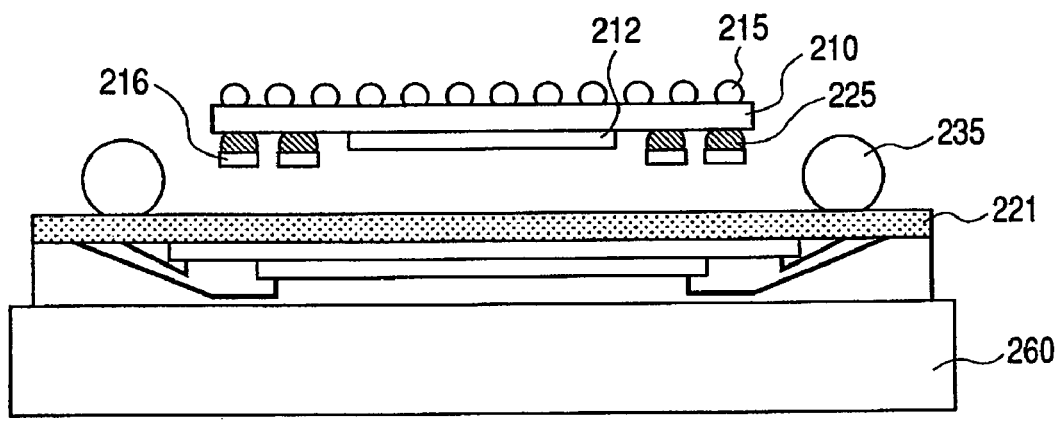

Then, as illustrated in FIG. 9B, the first package substrate 211 is flipped and stacked on the second package substrate 221. In this flipped substrate, a first LSI 212 which functions as an MPU circuit is mounted on a lower surface of the first package substrate 211. The solder ball group 225 is attached to surround the first LSI 212. Flux 216 (Deltalux 529D-1 available from Senju Metal Industry Co., Ltd.) is transferred to tip portions of the respective solder balls of the solder ball group 225. Further, the solder ball group 215 is attached to an upper surface of the first package substrate 211. When the first semiconductor package 110 is stacked on the second semiconductor package 120, the solder ball group 225 and the lands 126 for signal of the second package substrate 221 are aligned with each other. Here, the tip positions of the solder balls of the solder ball group 235 and the tip positions of the solder balls of the solder ball group 225 are on the same plane. In this embodiment, the pitch between the solder balls of the solder ball group 225 is 0.5 mm. In this case, generally, it is desirable that coplanarity of the solder ball group 235 and the solder ball group 215 is made 0.07 mm or less. However, even if the coplanarity is not satisfied, the size of the solder ball group 235 and the size of the lands for attaching electrodes can be adjusted.

Figure 9C:
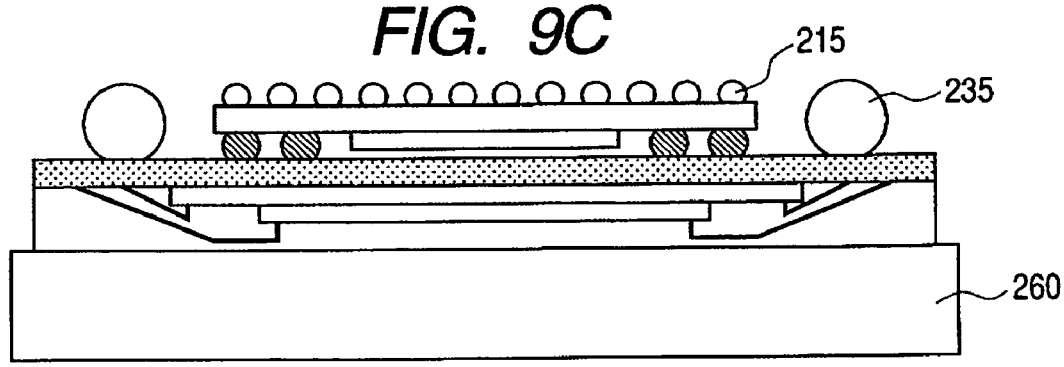

Next, the first package substrate 211 and the second package substrate 221 in a stacked state on the jig substrate 260 are introduced into a reflow furnace which is not shown. By raising a temperature not lower than melting points of Sn, Ag, and Cu (217° C.-220° C.) contained in the solder to melt the solder ball group 225 and then cooling the solder all group 225, the first package substrate 211 and the second package substrate 221 are joined together as illustrated in FIG. 9C. Here, the flux 216 is evaporated by being heated.

Figure 9D:
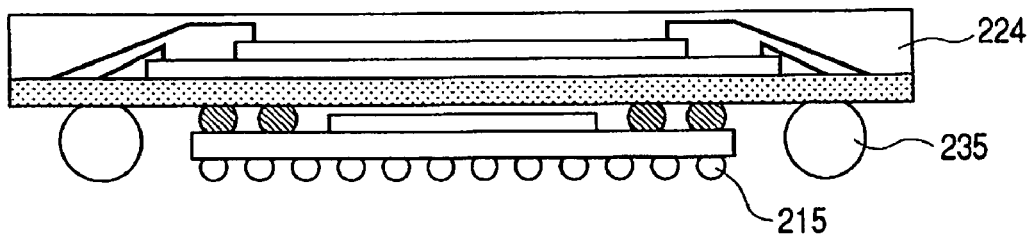

Next, by removing from the jig substrate 260 and flipping the joined first package substrate 211 and second package substrate 221, manufacture of the stacked semiconductor package illustrated in FIG. 9D is completed.

After that, the stacked semiconductor package 200 is mounted on a printed wiring board through solder paste printing, mounting, and reflow processes which are similar to processes of an ordinary surface-mount component. Here, the solder ball group 235 is connected to a power supply of the printed wiring board.

As described in the above, by attaching in advance the solder ball group 225 to the surface of the first package substrate 211, then flipping them and stacking the first package substrate 211 to the second package substrate 221, and joining them together, it is possible to make easy the alignment between the first package substrate 211 and the second package substrate 212. Further, the lands can be formed by an SMT mounter similar to a conventional one, and, even when solder balls of a plurality of sizes are disposed, it is not necessary to use an expensive ball mounting equipment. Therefore, a high precision stacked semiconductor package can be manufactured without increasing the manufacturing cost.

Third Embodiment

Figure 10A:
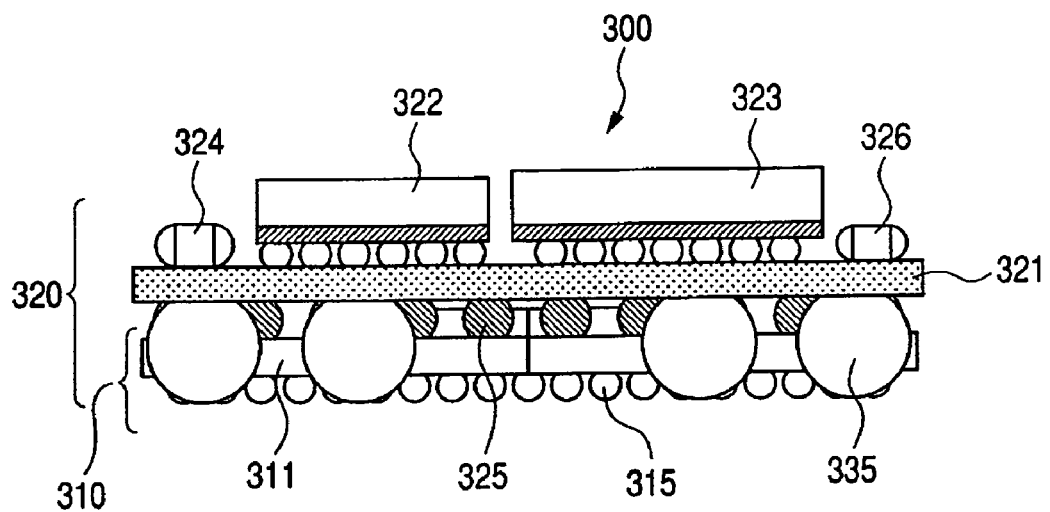
FIGS. 10A and 10B are a sectional view and a plan view, respectively, of a stacked semiconductor package according to third Embodiment of the present invention.
Figure 10B:
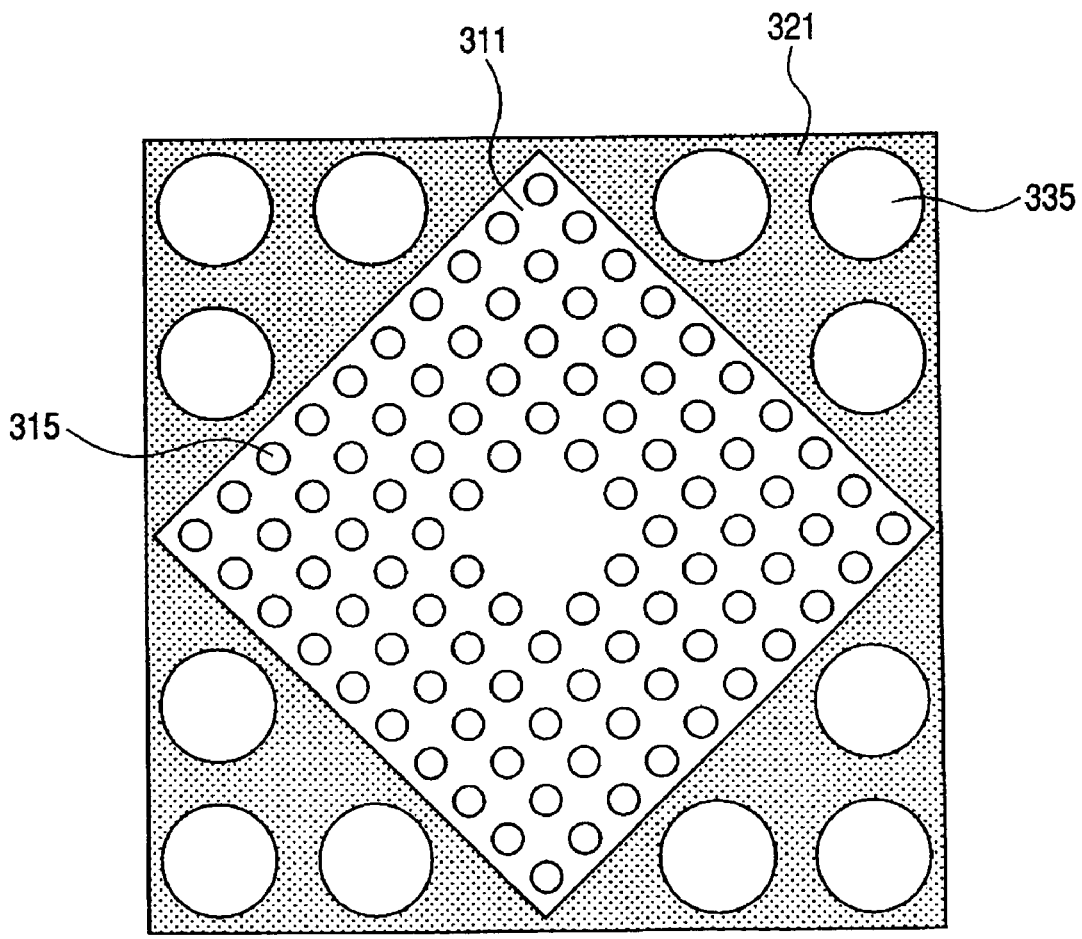

FIGS. 10A and 10B are schematic views of a stacked semiconductor package 300 according to third Embodiment of the present invention. FIG. 10A is a sectional view of the stacked semiconductor package 300 and FIG. 10B is a plan view seen from the bottom. The stacked semiconductor package 301 has a two-layer structure composed of a first semiconductor package 310 and a second semiconductor package 320.

The first semiconductor package 310 is formed of a first package substrate 311, a first LSI 312. The first LSI 312 is mounted on an upper surface of the first package substrate 311 by a flip chip method. The LSI 312 is an MPU circuit which is responsible for the functionality of the product. A lower surface of the first package substrate 311 is electrically connected to the printed wiring board (not shown) through a solder ball group 315.

The second semiconductor package 320 is formed of a second package substrate 321, a flash memory 322 as a second LSI, a dynamic random access memory (DRAM) 323 as a third LSI, a chip capacitor 324 as an electric circuit component, and a chip resistor 326 as a damping resistor. The area of the upper and lower surfaces of the second package substrate 321 is larger than the upper and lower surfaces of the first package substrate 311. The second LSI 322 and the third LSI 323 are mounted on the upper surface of the second package substrate 321 by a flip chip method. The LSIs 322 and 323 are LSIs which function as a memory for data processing. The first semiconductor package 310 and the second semiconductor package 320 are electrically connected through a solder ball group 325. The second semiconductor package 320 is electrically connected to the printed wiring board through a solder ball group 335. The diameter of solder balls of the solder ball group 335 is larger than the diameter of solder balls of the solder ball group 315 and the diameter of solder balls of the solder ball group 325.

As can be seen from FIG. 10B, the solder ball group 335 is disposed in the four corners of the second semiconductor package 320. More specifically, the first semiconductor package 310 having an area smaller than that of the second semiconductor package 320 is disposed at a center portion of the second semiconductor package 320 in a state of rotating the first semiconductor package 310 and tilts by 45 degrees. Here, the solder ball group 335 of a larger diameter is connected to lands for power supply of the second package substrate 321, and is also connected to lands for power supply of the printed wiring board and to lands for a GND. It should be noted that the rotation angle of the first semiconductor package 310 with respect to the second semiconductor package 320 is not limited to 45 degrees, and may be appropriately selected depending on the sizes of the package substrates, the sizes and the number of the solder balls, and the like.

Next, a method of manufacturing the stacked semiconductor package 300 according to third Embodiment is now described with reference to FIGS. 11A, 11B, 11C, 11D, 11E and 11F. FIGS. 11A, 11B, 11C, 11D, 11E and 11F are schematic sectional views illustrating process steps for manufacturing the stacked semiconductor package 300. In the present embodiment, by mounting a plurality of semiconductor packages on one module substrate 301 and then cutting a module substrate 301, a plurality of the stacked semiconductor packages 300 are manufactured at the same time. The module substrate 301 is cut to form the second package substrate 321, that is, both are substantially the same members.

Figure 11A:
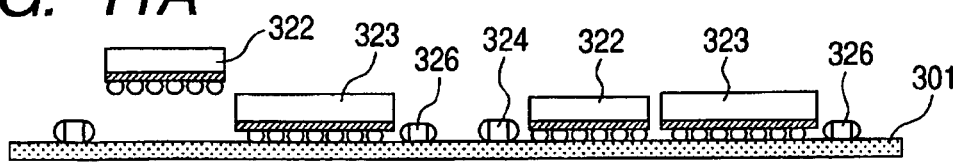
FIGS. 11A, 11B, 11C, 11D, 11E, and 11F are sectional views illustrating a method of manufacturing the stacked semiconductor package according to third Embodiment of the present invention.
Figure 11B:
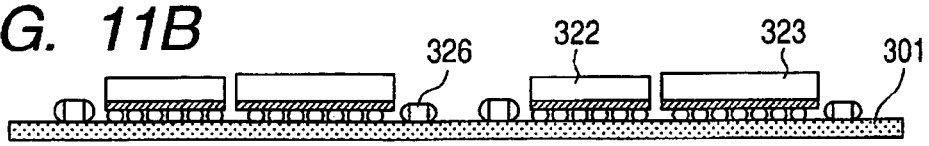

First, cream solder (not shown) is printed on one side of the module substrate 301 which is a two-layer wiring board at a thickness of 0.2 mm. Then, as illustrated in FIGS. 11A and 11B, a multi chip package (MCP) where the flash memory LSI 322 and the DRAM 323 are stacked, the chip capacitor 324 as a decoupling capacitor, and the chip resistor 326 as a damping resistor are mounted on the module substrate 301.

Next, the module substrate 301 having the LSIs and electronic components mounted thereon is introduced into a reflow furnace. The module substrate 301 is heated to a temperature not lower than the melting point of the solder and then cooled to room temperature. This joins the flash memory LSI 322, the DRAM 323, the chip capacitor 324, and the chip resistor 326 to the module substrate 301.

Figure 11C:
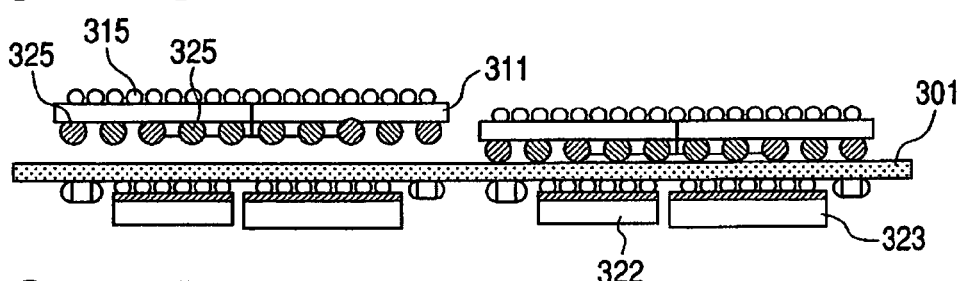

Next, the module substrate 301 is flipped. Then, cream solder is printed on lands where the module substrate 301 and the first semiconductor package 310 are to be joined together. Then, as illustrated in FIG. 11C, the first semiconductor package 310 at a height of 0.8 mm where the solder ball groups 315 and 325 are provided on both sides of the first package substrate 311 is mounted on the module substrate 201. Here, as illustrated in FIG. 10B, the first semiconductor package 310 is mounted to rotate by 45 degrees with respect to the module substrate 301. This structure makes it easier to form a signal line in the module substrate 301, which increases the flexibility in design of the substrate.

Figure 11D:
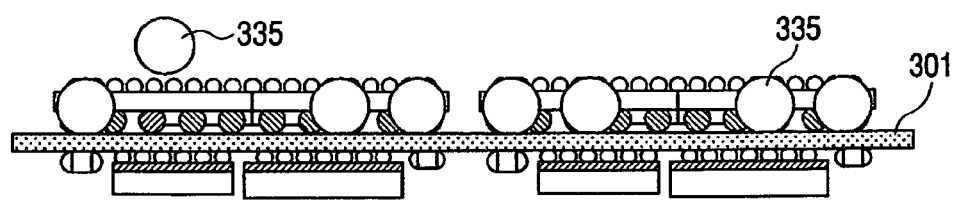

Then, the solder balls 335 which are placed in respective pockets of a reel tape and the diameter of which is $\phi 0.80$-$0.85$ mm are set in a feeder unit of a mounter which is not shown, and, similarly to ordinary chip components, mounted on predetermined locations one by one using an absorption nozzle of the mounter. FIG. 11D illustrates a state where the solder balls 335 are mounted. It should be noted that the solder balls 335 may be supplied to the mounter not using the reel tape but using a bulk case. Especially, when the solder balls are spherical, since they have no directionality, it is easy for the mounter to use such a bulk case in supplying the solder balls.

Figure 11E:
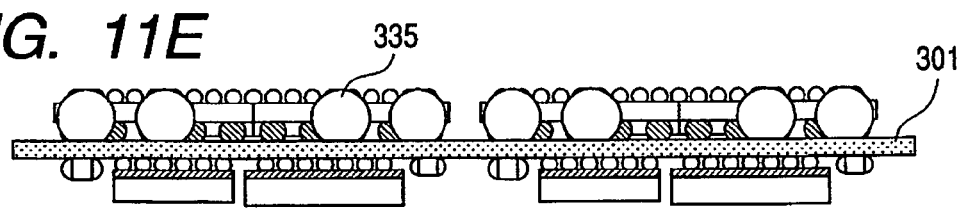

Next, as illustrated in FIG. 11E, the module substrate 301 is again introduced into the reflow furnace and is heated. This melts the cream solder to join the solder ball group 315 of the first semiconductor package 310 and the solder ball group 335 of a larger diameter to the module substrate 301.

Figure 11F:
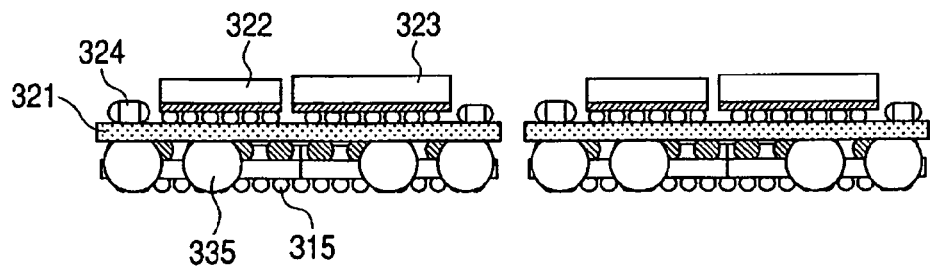

Finally, as illustrated in FIG. 11F, the module substrate 301 is cut to obtain stacked semiconductor packages. The module substrate 301 is cut by, for example, a router, a dicer, or a laser.

In the present embodiment, use of the module substrate 301 allows manufacture of a stacked semiconductor package with ease using an ordinary double-sided SMT reflow process. Therefore, even a plurality of packages can be stacked easily. Further, a decoupling capacitor and a damping resistor can also be mounted at the same time, and thus, the signal quality can be enhanced.

Further, since the solder ball group 335 of a larger diameter can also be mounted at the same time using a mounter, adjustment of the size of the solder balls and the like are very easy, and coplanarity of a mounting surface can be improved. This not only decreases poor connection when a stacked semiconductor package is mounted on a printed wiring board but also accommodates connection with a narrower pitch.

Fourth Embodiment

Figure 12:
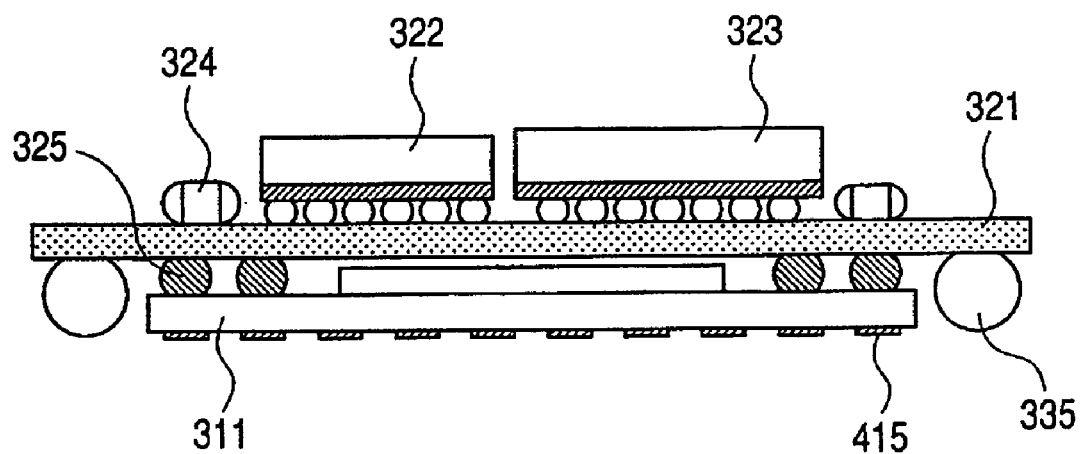
FIG. 12 is a sectional view of the stacked semiconductor package according to fourth Embodiment of the present invention.

In first, second and third Embodiments, the first semiconductor package is connected to the printed wiring board with the solder ball group. In the present embodiment, connection between the first semiconductor package and the printed wiring board is not limited to the solder ball group. FIG. 12 is a schematic view of a stacked semiconductor package 400 according to fourth Embodiment of the present invention. In the present embodiment, the first semiconductor package 410 is mounted on a printed wiring board (not shown) with a land grid array (LGA) 415. The structure other than the LGA 415 is the same as that of second Embodiment, and the same reference numerals designate the same members.

In the present embodiment, in order to suppress a height necessary for attaching the semiconductor module, an LGA 415 is adopted in the first semiconductor package 310. This makes it possible to make smaller the size of the solder ball group 335 compared with that in second Embodiment. More particularly, when a first semiconductor package having the same size as in second Embodiment is used, the diameter of the solder ball group 335 is ϕ0.50-0.60 mm. On the other hand, the diameter of the solder ball group 235 in second Embodiment is ϕ0.80-0.85 mm. The diameter of the solder ball group 335 in the present embodiment can be made substantially smaller than that in second Embodiment. This can decrease the pitch for attaching the solder balls of the solder ball group 335, can decrease the area for attaching the solder ball group 335, and thus, can realize a smaller stacked semiconductor package.

Further, if there is a margin to some extent for the height necessary for attaching the semiconductor module, in order to improve the joining of the stacked semiconductor package to the printed wiring board, lands for connection of the first semiconductor package may be hemispherical bumps precoated with solder. These bumps can improve wettability when mounting on the printed wiring board is carried out and can absorb heat distortion of the semiconductor package substrate in a reflow heating process to improve the joining.

Figure 13:
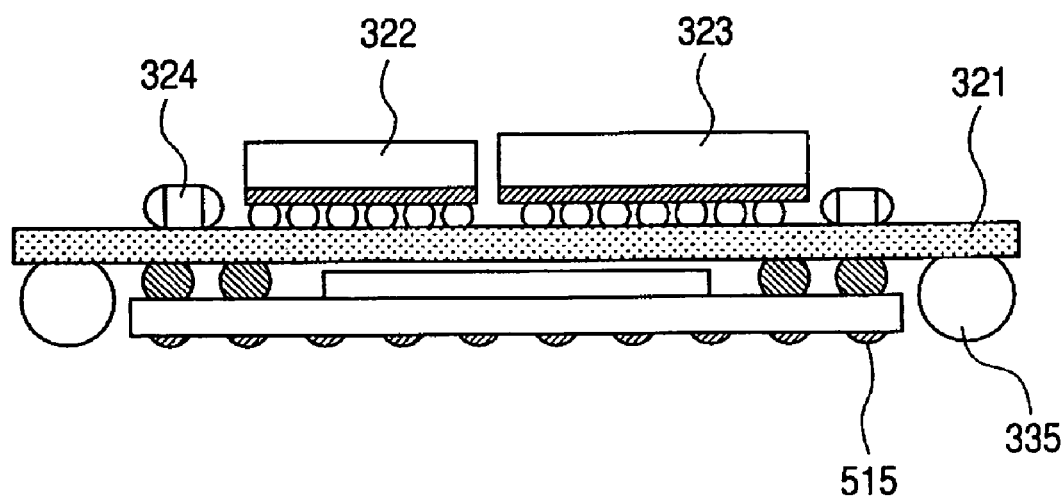
FIG. 13 is a sectional view illustrating a variation of the stacked semiconductor package according to fourth Embodiment of the present invention.

Further, instead of the land grid array (LGA) 415, a bump grid array 515 as illustrated in FIG. 13 may be used. Use of the bump grid array 515 has an effect similar to the use of the land grid array (LGA) 415.

It should be noted that, in the present embodiment, the stacked semiconductor package substrate has a two-layer structure in which the first semiconductor package 110 and the second semiconductor package 120 are stacked. However, the present invention is not limited thereto, and three or more semiconductor packages may be stacked.

Figure 14:
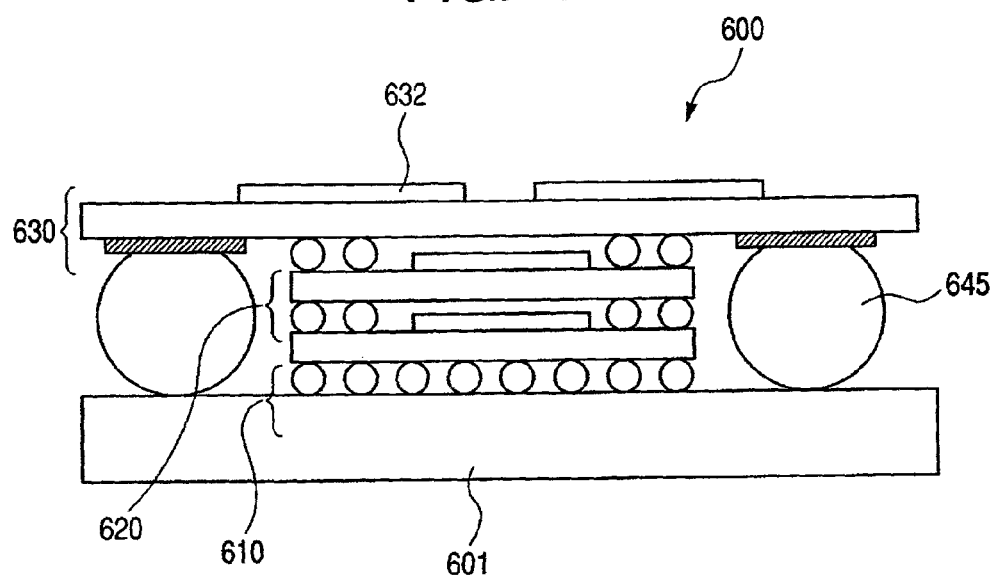
FIG. 14 is a sectional view of a stacked semiconductor package according to another embodiment of the present invention.

FIG. 14 is a sectional view of a stacked semiconductor package 600 in which a first semiconductor package 610, a second semiconductor package 620, and a third layer semiconductor package 630 are stacked. In FIG. 14, the third layer semiconductor package 630 is directly connected to a printed wiring board 601 with a solder ball group 645 of a larger diameter. Electric power can be directly supplied to an LSI 632 mounted on the third layer semiconductor package 630 through the solder ball group 645 and lands 636 for power supply.

Figure 15:
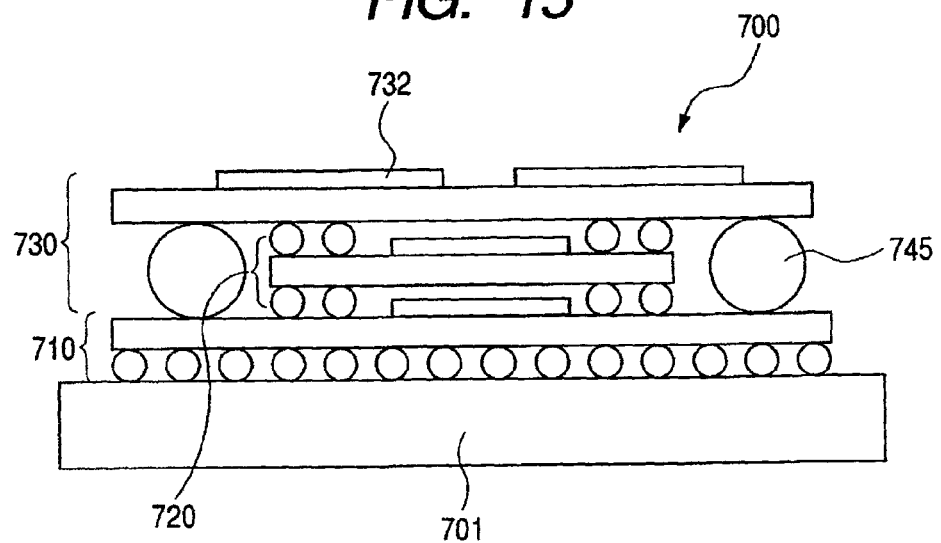
FIG. 15 is a sectional view of a stacked semiconductor package according to still another embodiment of the present invention.
Figure 16:
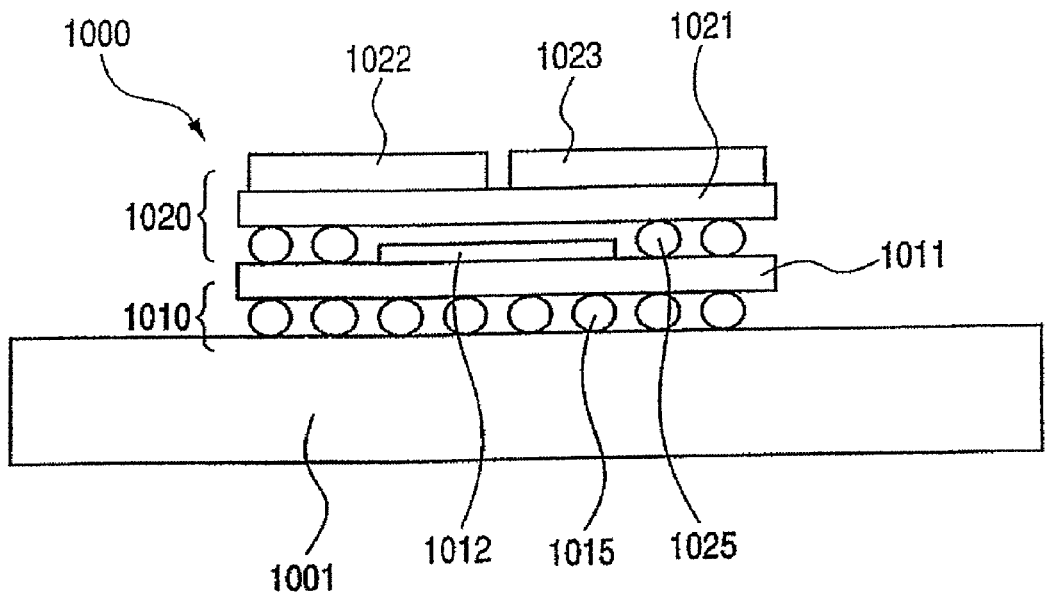
FIG. 16 is a sectional view of a conventional stacked semiconductor package.

FIG. 15 is a sectional view of a stacked semiconductor package 700 where a first semiconductor package 710, a second semiconductor package 720, and a third layer semiconductor package 730 are stacked. In FIG. 14, the third layer semiconductor package 730 is joined to the first semiconductor package with a solder ball group 745 of a larger diameter. Electric power can be supplied from the first semiconductor package 710 to an LSI 732 mounted on the third layer semiconductor package 730 through the solder ball group 745. Since the power supply path does not go through the second semiconductor package 720, stability can be given to the inductance of power supply wiring.

According to the present invention, since a power supply path is formed for directly supplying electric power to a semiconductor package substrate other than a first semiconductor package substrate from a printed wiring board of a stacked semiconductor package, change in the inductance of wiring can be suppressed. This can prevent power bounce from taking place, and makes it possible to stably transmit/receive a signal with high quality at a high speed. Further, similarly, a GND supply path can be formed directly from a printed wiring board.

Further, since it is not necessary to increase the number of lands in semiconductor package substrates of the respective layers of the stacked semiconductor package, it is also not necessary to make larger the stacked semiconductor package.

Especially, the number of lands in the first semiconductor package substrate can be decreased to make smaller the substrate.

Further, since a plurality of different power supplies can be supplied to a semiconductor package substrate other than the first semiconductor package substrate from the printed wiring board, a plurality of LSIs which function at different power supply voltages can be easily designed, and the functionality of the stacked semiconductor package can be improved.

This application claims priority from Japanese Patent Application Nos. 2005-079878 filed on Mar. 18, 2005 and 2006-050593 filed on Feb. 27, 2006 which are hereby incorporated by reference herein.

What is claimed is:

1. A stacked semiconductor package formed by stacking a plurality of semiconductor packages, comprising:
    a first semiconductor package mounted on a printed wiring board, the first semiconductor package including:
        a first semiconductor package substrate,
        at least one first large scale integration circuit mounted on the first semiconductor package substrate, and
        a first solder ball group attached to the first semiconductor package substrate, for joining to the printed wiring board; and
    a second semiconductor package stacked on the first semiconductor package, the second semiconductor package including:
        at least one second large scale integration circuit mounted on the second semiconductor package substrate,
        a second solder ball group attached to the second semiconductor package substrate, for joining to the first semiconductor package, and
        a solder group attached to the second semiconductor package substrate, for joining to the printed wiring board without joining to the first semiconductor package.

2. A stacked semiconductor package according to claim 1, wherein the solder group attached to the second semiconductor package substrate is a solder ball group, and a diameter of each solder ball in the solder group is larger than a diameter of each solder ball in the first solder ball group and is larger than a diameter of each solder ball in the second solder ball group.

3. A stacked semiconductor package according to claim 1, wherein the solder group is a cylindrical solder group, and a height of the cylindrical solder group is larger than a diameter of solder balls of the first and second solder ball groups.

4. A stacked semiconductor package according to claim 1, wherein the second semiconductor package substrate has an area larger than an area of the first semiconductor package substrate, and the first semiconductor package substrate is arranged at such a position that the first semiconductor package substrate does not protrude from an outer periphery of the second semiconductor package substrate.

5. A stacked semiconductor package according to claim 1, wherein the solder group attached to the second semiconductor package substrate is a solder group for a power supply for supplying electric power to the at least one second large scale integration circuit mounted in the second semiconductor package.

6. A stacked semiconductor package according to claim 1, wherein the solder group attached to the second semiconductor package substrate is a solder group for a ground for the at least one second large scale integration circuit mounted on the second semiconductor package.

7. A stacked semiconductor package according to claim 1, wherein tip positions of the first solder ball group and tip positions of the solder group are on a same plane.

8. A stacked semiconductor package according to claim 1, wherein the solder group is disposed to surround the first semiconductor package.

9. A stacked semiconductor package according to claim 8, wherein the solder group is disposed only at a corner of the second semiconductor package.

10. A stacked semiconductor package according to claim 9, wherein both the first semiconductor package substrate and the second semiconductor package substrate have a square shape, and the first semiconductor package substrate is arranged such that the first semiconductor package substrate is rotated on a plane including the substrate by a predetermined angle with respect to the second semiconductor package.

11. A stacked semiconductor package according to claim 4, wherein the solder group is disposed along two sides of the first semiconductor package opposed to each other.

* * * * *